United States Patent
Gotoh et al.

(10) Patent No.: US 6,642,449 B2
(45) Date of Patent: Nov. 4, 2003

(54) ELECTRONIC COMPONENT AND MANUFACTURING METHOD THEREOF

(75) Inventors: Masashi Gotoh, Tokyo (JP); Kouji Tashiro, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/366,408

(22) Filed: Feb. 14, 2003

(65) Prior Publication Data

US 2003/0147196 A1 Aug. 7, 2003

Related U.S. Application Data

(62) Division of application No. 09/768,622, filed on Jan. 25, 2001, now Pat. No. 6,548,758.

(30) Foreign Application Priority Data

Jan. 26, 2000 (JP) ........................................ 2000-016835

(51) Int. Cl.⁷ .............................................. H01L 23/02
(52) U.S. Cl. ..................................... 174/52.4; 174/52.1
(58) Field of Search ............................. 174/52.4, 52.1, 174/52.2, 262, 266

(56) References Cited

U.S. PATENT DOCUMENTS

5,315,104 A * 5/1994 Plumb ..................... 250/214.1
5,745,333 A    4/1998 Frankeny et al. ........... 361/313

FOREIGN PATENT DOCUMENTS

JP          10-112216        4/1998

* cited by examiner

*Primary Examiner*—Hung V. Ngo
(74) *Attorney, Agent, or Firm*—Oblon, Spivak, McClelland, Maier & Neustadt, P.C.

(57) ABSTRACT

In the case where an electrode conductor is formed on a principal plane of an element 10, a method including a step of forming an electrode conductor section 13 composed of a conductor pattern having a photosensitive conductive paste exposed and developed on the principal plane, and a step of forming an electrode conductor section 11 of a non-photosensitive conductive paste, wherein both electrode conductor sections 11, 13 are disposed on the surface of the element 10 so as to be at least partly contacted or overlapped with each other.

5 Claims, 14 Drawing Sheets

FIG.2A
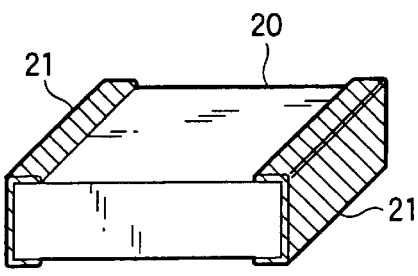
FIG.2B
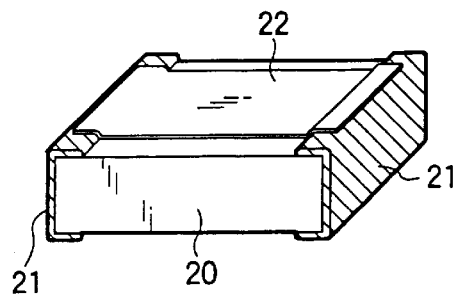
FIG.2C
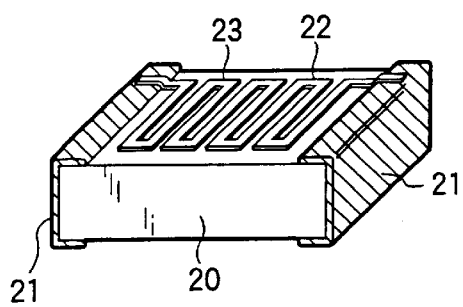
FIG.2D
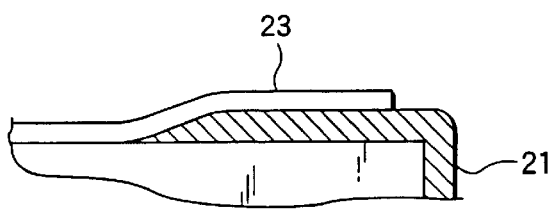
FIG.2E
| |
|---|
| FORMING AN ELECTRODE CONDUCTOR SECTION OF NON-PHOTOSENSITIVE CONDUCTIVE PASTE — #11 |
| ↓ |
| DRYING — #12 |
| ↓ |
| APPLYING THE PHOTOSENSITIVE CONDUCTIVE PASTE OVER AGAIN TO OVERLAP THE ELECTRODE CONDUCTOR SECTION FORMED OF NON-PHOTOSENSITIVE CONDUCTIVE PASTE — #13 |
| ↓ |
| DRYING — #14 |
| ↓ |
| EXPOSING AND DEVELOPING — #15 |
| ↓ |
| SINTERING — #16 |

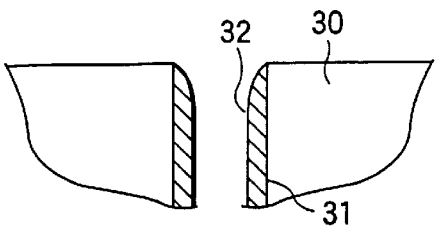
FIG.3A
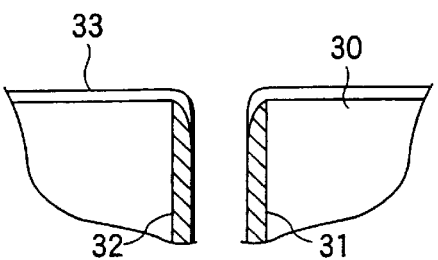
FIG.3B
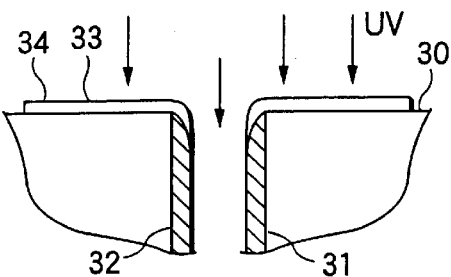
FIG.3C
FIG.3D
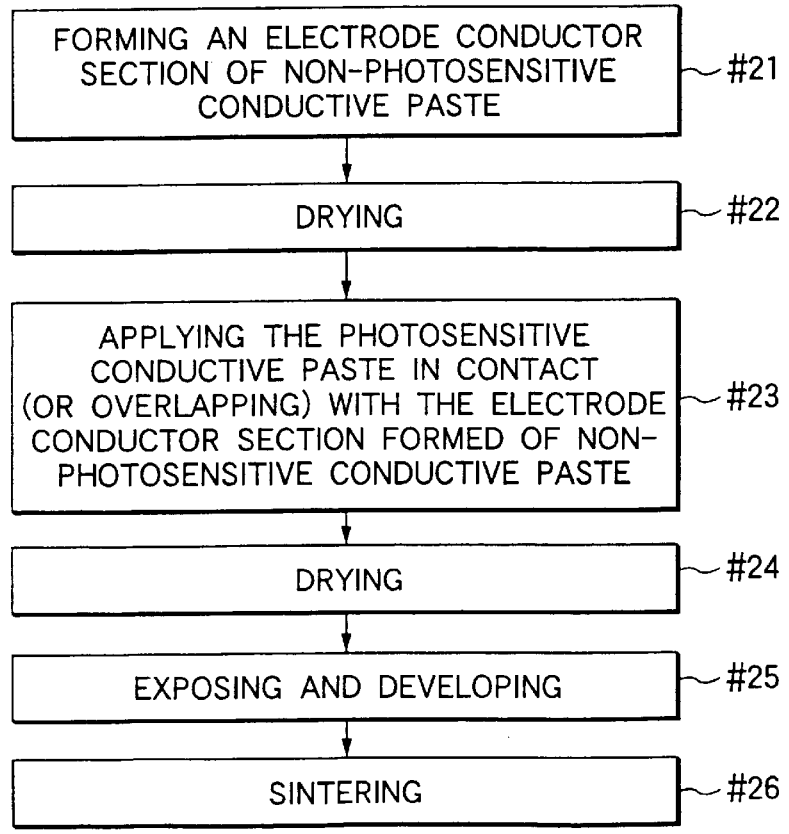

FIG.10A
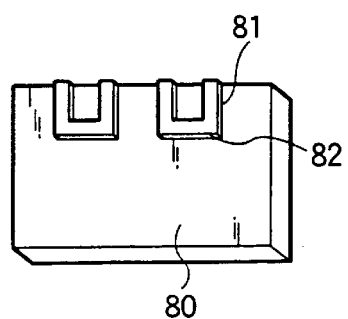
FIG.10B
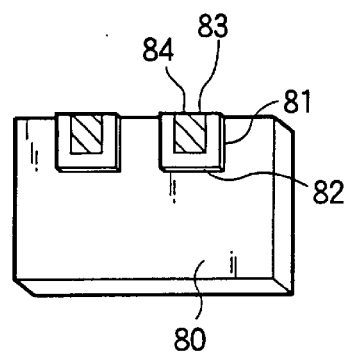
FIG.10C
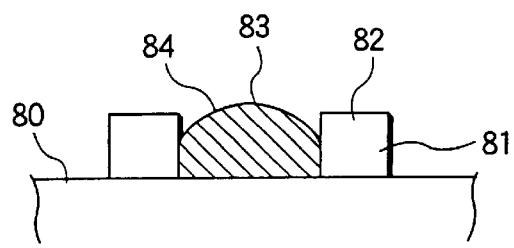
FIG.10D
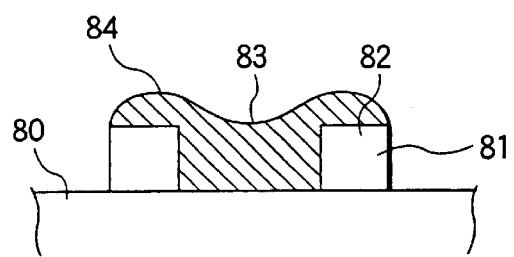
FIG.10E
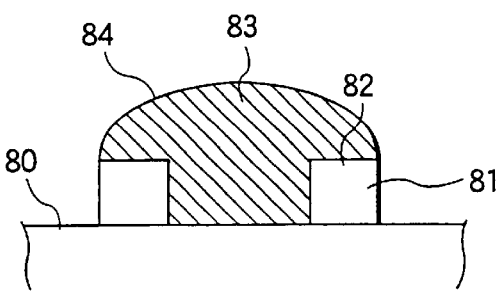
FIG.11A
FIG.11B
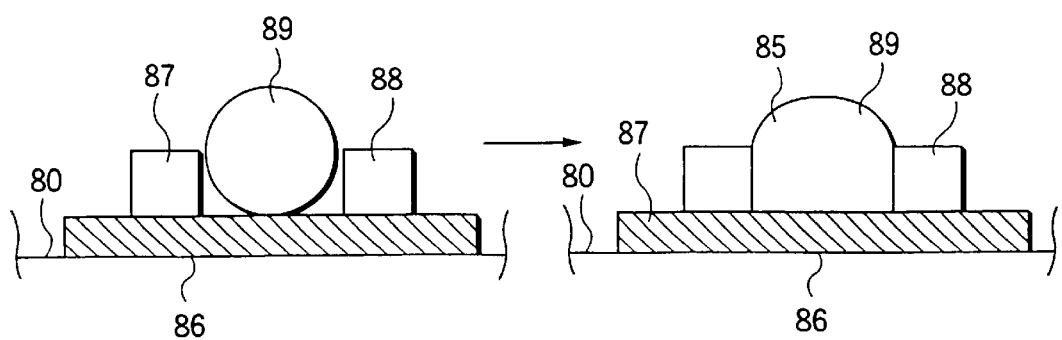

ELECTRONIC COMPONENT AND MANUFACTURING METHOD THEREOF

This application is a division of application Ser. No. 09/768,622 filed on Jan. 25, 2001, U.S. Pat. No. 6,548,758.

BACKGROUND OF THE INVENTION

The present invention relates to an electronic component having an electrode conductor formed of a photosensitive conductive paste and a non-photosensitive conductive paste, which are formed on an element, and a method for manufacturing the electronic component, and more particularly to an electronic component comprising an electrode conductor that is suitable for a chip inductor, an LC filter, a dielectric filter, and a non-reciprocal circuit element (circulator, isolator), and a manufacturing method for manufacturing this electronic component.

A conductive pattern for an electronic component is required to be fine and highly reliable. For example, recently, the portable telephones have advanced for higher frequency, and a number of leadless parts that have excellent frequency characteristics have been employed. In particular, for the electrode portions, it is demanded that the fine patterns as precise as in units of micron are produced stably at high yield. At the same time, the strength to withstand severe environments including high temperatures, vibrations, and humidity is required with high reliability.

Regarding the pattern precision, in the package for a chip inductor, a ceramic substrate, a ceramic multi-layer substrate or a semiconductor, for example, it is already required that the pattern precision, the pitch size or the line-and-space of an electrode conductor may be as small as 30 $\mu$m to 50 $\mu$m or below, because the current requirements for smaller size and higher frequency can not be met with the sizes of 100 $\mu$m to 150 $\mu$m as conventionally employed.

The mounting pattern or the electrode of mounted portion is demanded to be stronger and more highly reliable, because of the miniaturization. Further, the recent lead free trend causes the soldering temperatures to be raised, and there is a requirement for the heat-resisting electrode to withstand the high temperatures.

To form an electrode or a conductor pattern on the surface, a thick film printing method using the conductive paste is generally used, because the vacuum deposition involves a smaller film thickness of conductor, and the lower productivity. Employing a screen and a squeeze, a silver paste is printed on a ceramic element to form a conductor pattern. Thereafter, a drying process is undergone, and the conductor pattern is sintered at a temperature from about 450° C. to 1000° C., whereby an electrode conductor is formed.

With the above screen printing method, there are a variety of dimensional dispersion factors to form the fine conductive patterns at high precision and stably, including (1) positional precision of screen, (2) positional precision of jig, (3) exudation of paste, (4) blurred printing, (5) degradation of screen, and (6) degradation of squeeze. Due to such an influence, the ultimate electrical characteristic (e.g., the inductance for a chip inductor, or the filter characteristic for a dielectric filter) may be affected. Consequently, it was obliged to make the trimming using a router which took a lot of steps with the filter to obtain good products.

In particular, in the case where there are irregularities or through holes such as an electrode on the end face of a chip element or a dielectric filter, it is not possible to solve the problems only by the screen printing of conductive paste. As a specific example, a dielectric filter having a fine conductor pattern formed on one side of the through hole in the dielectric block will be described below.

In the case where the pattern printing is made on the dielectric block of the dielectric filter as above constituted, a plurality of dielectric blocks are arranged on a jig at a time in consideration of the productivity, and then the screen printing is made using the conductive paste.

FIGS. 17A to 17E show a pattern printing process with the conventional screen printing. FIG. 17A shows a step of arranging the dielectric blocks 1 on a printing jig 2. The dielectric blocks 1 are arranged on the jig 2 having a plurality of cavities 3. FIG. 17B shows a cross section of the jig 2, in which the dielectric blocks 1 provided in the cavities 3 are arranged at a fixed spacing. FIG. 17C shows a step of printing a conductive paste 4, in which the conductive paste 4 is printed in a pattern 8 by a squeeze 6, using a printing screen 5 with a predetermined pattern.

However, the screen 5 has originally no distortion as shown in FIG. 17D, but the screen 5 may be distorted as shown in FIG. 17E by repeating this operation. The reason is that in the case where the dielectric blocks 1 are arranged on the jig 2 as shown in FIG. 17C, it is necessary to withstand a printing pressure only with the printing screen 5 at a portion of the spacing ΔW on either side of the jig 2. Consequently, the printing screen 5 is loaded, and stretched, so that the positional precision is significantly worse.

On the contrary, since the screen printing is limited in respect of fineness, it has been examined in recent years that an electrode conductor of a predetermined pattern is produced through an exposure and development process (photo lithography process) using a photosensitive conductive paste (conductive paste having photo sensitivity).

In a production method employing such photosensitive conductive paste, the fine conductor pattern can be produced, but the following problems remain.

(1) Particularly, the screen printing has a drawback that a mesh mark produces a pinhole defect. Regarding this point, means for enhancing the flowability of photosensitive conductive paste was proposed in JP-A-10-112216.

(2) If a thick film is formed at a time, it takes not only considerable time to make exposure, but also the pattern precision is degraded. Therefore, it may be difficult to obtain a film thickness required for the electrode conductor of electronic component at a time. For example, in the case of an electrode conductor in the soldered portion, if the conductor is Ag, the amount (thickness) of conductor melting into the eutectic solder is 2.5 $\mu$m at 250° C., and 5 $\mu$m at 280° C. On the other hand, the photosensitive conductive paste is applied normally in a thickness of 10 to 20 $\mu$m to make the treatment at high precision and an exposure time to increase the productivity. In this case, after sintering, the conductive paste has a thickness of about 5 to 10 $\mu$m. Accordingly, with an Ag thickness of 5 $\mu$m, the conductor Ag is exhausted at 280° C. in one second.

(3) It is difficult to make exposure for the portion perpendicular to the light, particularly, the though hole with a large aspect ratio. It is difficult to form the through hole.

(4) The photosensitive conductive paste is often inferior to the non-sensitive conductive paste (conductive paste having no photosensitivity) available at present in the respects of conductivity or film thickness. Hence, it is difficult to obtain the photosensitive conductive paste having conductivity and film thickness comparable to those of the non-photosensitive conductive paste, or cheaper in the costs.

In this way, in the case where the electrode conductor is formed using the photosensitive conductive paste, there are a number of items that have not been solved yet.

SUMMARY OF THE INVENTION

It is an object of the present invention to provide an electronic component capable of not only enhancing the pattern printing precision which was the conventional problem, but also forming a pattern and an electrode in a predetermined film thickness suitable for the location where the electronic component is employed, and further forming the electrode in the portion with a high aspect ratio, and a method for manufacturing the electronic component.

Other objects and new features of the present invention will be more apparent when reading the following embodiments.

According to first aspect of the present invention, there is provided an electronic component comprising: a first electrode conductor section formed of the non-photosensitive conductive paste on a surface connected with a principal surface, an end portion at the principal surface side being made taper shape; and a second electrode conductor section having the photosensitive conductive paste exposed and developed on said principal surface; in that the end portion of the first electrode conductor section having a taper shape is overlapped at least a part of the second electrode conductor.

Preferably, the first electrode conductor section formed of said non-photosensitive conductive paste may constitute an end face electrode or a side face electrode on an end face or a side face of said component.

Preferably, the surface connecting with said principal surface may have a taper connection face, and the second electrode conductor formed by said photosensitive conductive extends from said principal plane to said taper connection face to overlap each other.

According to a second aspect of the present invention, there is provided an electronic component comprising: a first electrode conductor section formed of said non-photosensitive conductive paste on a principal surface; and a second electrode conductor having said photosensitive conductive paste exposed and developed, and being at least partly overlapped on said first electrode conductor, wherein contours of the overlapped areas of both first and second electrode conductor sections being coincident.

Preferably, the contours of the overlapped areas of both electrode conductor sections may be coincident and constitute the bumps.

According to third aspect of the invention, there is provided an electronic component comprising: a first electrode conductor section having said photosensitive conductive paste exposed and developed, by which an electrode area is defined; and a second electrode conductor section formed of a non-photosensitive conductive paste, which is formed in the electrode are a defined by said first electrode conductor section.

According to fourth aspect of the invention, there is provided an electronic component comprising: a dielectric block; a first electrode conductor section having a photosensitive conductive paste exposed and developed on a principal surface of said dielectric block; and an inner peripheral electrode conductor section formed of a non-photosensitive conductive paste on an inner peripheral face of a through hole that is opened through said principal surface, in that both electrode conductor sections are overlapped at least partly near an opening portion of said through hole on said principal plane to electrically conducts to make up a dielectric filter.

Preferably, according to the invention, the electrode conductor section formed of said photosensitive conductive paste and the electrode conductor section formed of said non-photosensitive conductive paste are at least partly overlapped with each other and sintered.

According to the fifth aspect of the invention, there is provided a method for manufacturing an electronic component comprising the steps of: forming a first electrode conductor section of a non-photosensitive conductive pattern on a surface connected with a principal surface, an end portion at the principal surface side being made taper shape the other plane; forming a second electrode conductor section having a photosensitive conductive paste exposed and developed on said principal surface; in that the end portion of the first electrode conductor section having a taper shape is overlapped at least a part of the second electrode conductor Preferably, the surface connecting with said principal surface may have a taper connection face, and the second electrode conductor formed by said photosensitive conductive extends from said principal plane to said taper connection face to overlap each other.

According to the sixth aspect of the invention, there is provided a method for manufacturing the electronic component comprising the steps of: forming a first electrode conductor section of a non-photosensitive conductive pattern on a principal surface; forming a second electrode conductor section having a photosensitive conductive paste exposed and developed on said principal surface, the second electrode conductor section being at least partly overlapped on said first electrode conductor section; patterning said first electrode conductor section of the non-photosensitive conductive paste using said second electrode conductor section as a mask.

BRIEF DESCRIPTION OF THE DRAWINGS

FIGS. 2A to 2D are explanatory views showing a second embodiment of an electronic component, in which an electrode conductor section of the photosensitive conductive paste and an electrode conductor section of the non-photosensitive conductive paste are overlapped with each other;

FIG. 2E is a flowchart showing a method of manufacturing the electronic component according to the invention;

FIGS. 3A to 3C are explanatory views showing a third embodiment of an electronic component, in which a through hole is provided;

FIG. 3D is a flowchart showing a method of manufacturing the electronic component according to the invention;

FIGS. 10A to 10E are explanatory views showing a ninth embodiment of this invention, in which an electrode conductor section of the photosensitive conductive paste is employed for positioning;

FIGS. 11A and 11B are explanatory views showing a twelfth embodiment of this invention, in which an electrode conductor section of the photosensitive conductive paste is employed for positioning;

DETAILED DESCRIPTION OF THE PREFERRED EMBODIMENTS

The preferred embodiments of an electronic component and a method for manufacturing the electronic component according to the present invention will be described below with reference to the drawings.

First Embodiment

FIGS. 1A to 1D show a first embodiment of the invention, in which an electrode conductor section is patterned using a photosensitive conductive paste on a principal plane of an element, and an electrode conductor section is formed using a non-photosensitive conductive paste on the principal plane or the other plane, both electrode conductor sections being contacted at least partly to make an electrical connection.

Figure 1A:
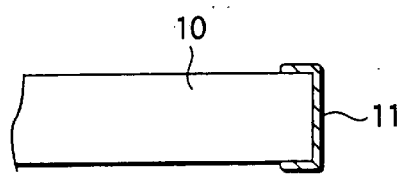
FIGS. 1A to 1C are explanatory views showing a first embodiment of an electronic component, in which an electrode conductor section of the photosensitive conductive paste and an electrode conductor section of the non-photosensitive conductive paste are contacted with each other.

In this case, in a step #1 of applying the non-photosensitive conductive paste, the non-photosensitive conductive paste is applied on the element 10 such as a dielectric or magnetic substance to make up an inductor, a condenser or a filter to form an electrode conductor section 11, and is then dried at 80° C. for ten minutes in a drying step #2, as shown in FIG. 1A.

Figure 1B:
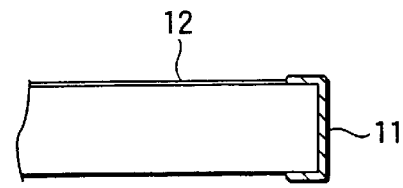

In a step #3 of applying the photosensitive conductive paste, a photosensitive conductive paste 12 is applied on the principal plane of the element to be in contact with the electrode conductor section 11 of the non-photosensitive conductive paste, and is dried at 80° C. for twenty minutes in a drying step #4, as shown in FIG. 1B.

Figure 1C:
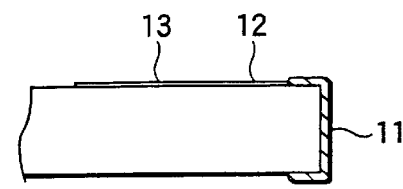
Figure 1D:
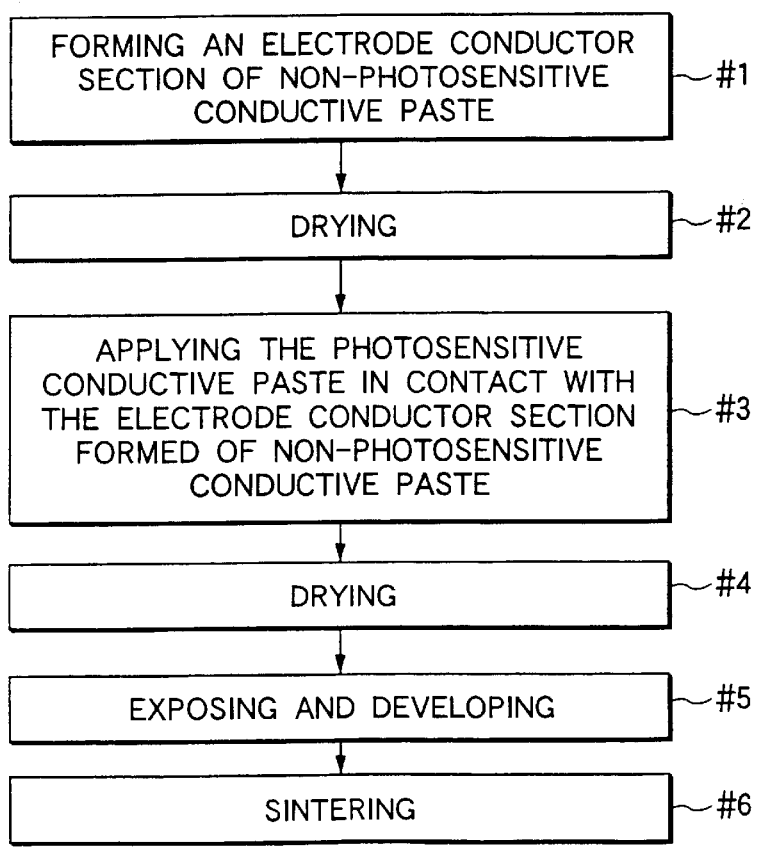
FIG. 1D is a flowchart showing a method of manufacturing the electronic component according to the present invention.

In a photolithography step #5, the photosensitive conductive paste 12 is exposed in a predetermined pattern to light from an exposure light source at 200 to 800 mJ/cm2. Thereafter, an unwanted portion of the photosensitive conductive paste is removed through a developing process. The development is conducted by spraying or dipping of an alkaline solution such as sodium carbonate, potassium carbonate, calcium hydroxide or sodium hydroxide at a temperature from 20° C. to 50° C. Specifically, it can be performed by spraying 0.4% $Na_2CO_3$ at 30° C. with a spray pressure of 10 to 20 psi, using a developing machine of conveyor, spray type. In such developing process, an electrode conductor section 13 having the photosensitive conductive paste 12 patterned is formed, as shown in FIG. 1C. The exposure is conducted by using the visible ray, near ultra-violet ray, ultra-violet ray, electron beam, X-ray, or laser beam, for example. Among them, the ultra-violet ray is preferable. The light sources may include a low pressure mercury lamp, a high pressure mercury lamp, an extra-high pressure mercury lamp, and a tungsten halogen bactericidal lamp. In particular, the extra-high pressure mercury lamp is preferable. The developing process is chosen not to have any effect on the non-photosensitive conductive paste.

Thereafter, in a sintering step #6, the electrode conductor section 11 of the non-photosensitive conductive paste and the electrode conductor section 13 of the photosensitive conductive paste are sintered at 850° C. for ten minutes at the same time, so that the electrode conductor section 11 and the electrode conductor section 13 are contacted with each other to form an electrode conductor that electrically conducts on the element 10 such as a dielectric or magnetic substance.

In this first embodiment, the application of the non-photosensitive conductive paste and the photosensitive conductive paste can be performed by screen printing. Also, since the electrode conductor section 11 of the non-photosensitive conductive paste with a great film thickness and excellent conductivity is obtained relatively easily, it can be employed as a terminal electrode section for outside connection or an electrode section for mounting the chip parts.

The electrode conductor section 13 of the photosensitive conductive paste can be formed in a fine pattern through the exposure and developing process, and can be utilized as an electrode section for an inductor, a condenser or a filter.

The metal materials for the conductive paste may include gold, silver, copper, palladium, platinum, and nickel, and a mixture thereof. It is important that the photosensitive material may contain an alkaline developing binder monomer, a monomer and an initiator, and be volatilized and decomposed by sintering, without leaving carbide in the pattern.

In this way, according to the first embodiment, there are a combination of merits for the electrode conductor section of the non-photosensitive conductive paste and the electrode conductor section of the photosensitive conductive paste. Hence, it is possible to fabricate the electronic component formed with the electrode conductor that is capable of not only enhancing the pattern precision which was the conventional problem but also having a predetermined film thickness and a pattern suitable for the service location. The specific effects are cited below.

(1) With a method of employing the photosensitive conductive paste, there is no need of pattern printing the conductive paste accurately, and the conductive paste may be only applied over the entire pattern formation face. Also, since in patterning, the photosensitive conductive paste is exposed using a mask, there is no need of applying a great pressure to the printing mask (screen) as conventionally performed. Accordingly, it is unnecessary to worry about the worse pattern accuracy which is caused by the degradation of screen.

(2) Further, owing to the exposure and developing process, the dimensional precision of pattern itself is high, the pattern is not distorted by the exudation of paste, and there is almost no dispersion in the pattern width. Accordingly, by forming the conductor pattern for an inductor or filter, it is possible to produce the inductor or filter with a high Q-value in the high frequency region.

(3) Since the non-photosensitive conductive paste is used in the terminal electrode section for outside connection or the electrode section for mounting the chip parts, the pattern can be formed in sufficient film thickness. There is no disconnection due to electrode erosion even if the soldering is made using the lead-free high temperature solder.

(4) In the case of inductor parts, more wiring patterns are formed on the substrate, whereby the inductance value is increased. The exudation of pattern and the dispersion in width should be not only less, but also the side face in section should be as vertical as possible. Using the photosensitive conductive paste, such conductor pattern can be formed. On the other hand, with a screen printing method employing the non-photosensitive conductive paste, if the element face is too rough, the pattern line width is varied. Conversely, if it is made flat, the paste may be exuded, making it difficult to control the viscosity of paste or the roughness.

(5) In the pattern section, no solder is needed. Hence the photosensitive conductive paste can be applied very thin, so that the pattern precision can be improved.

(6) The ultimate film thickness can be raised by plating. In this case, the cost up is of course inevitable by plating, and there is the problem that the thickness of electrode is smaller, and the dispersion in film thickness occurs relative to the other portions in the electrodes of floating island structure such as the end face electrode of dielectric filter or the HIC substrate. Further, in the case of fine patterns, there is the danger that a short failure may arise due to a phenomenon called a plating elongation (i.e., a short-circuit caused by the lateral growth of plating in the fine patterns or narrow pitch patterns). This embodiment can also solve such problem.

Second Embodiment

FIGS. 2A to 2E show a second embodiment of this invention, in which an electrode conductor section is patterned on a principal plane of an element using a photosensitive conductive paste, and an electrode conductor section is formed using a non-photosensitive conductive paste on the principal plane or the other plane, both electrode conductor sections being contacted at least partly to make an electrical connection.

In this case, in a step #11 of applying the non-photosensitive conductive paste, the non-photosensitive conductive paste is applied on the end portions (i.e., the end faces and the edges of its adjacent upper and lower faces) of an element 20 such as a dielectric or magnetic substance to make up an inductor, a condenser or a filter to form the electrode conductor sections 21, and is dried in a drying step #12, as shown in FIG. 2A.

Then, in a step #13 of applying the photosensitive conductive paste, a photosensitive conductive paste 22 is applied on a principal plane (herein an upper face) of the element 20 to overlap partly the electrode conductor section 21 of the non-photosensitive conductive paste, and is dried in a drying step #14, as shown in FIG. 2B.

In a photolithography step #15, the photosensitive conductive paste 22 is exposed in a predetermined pattern. Thereafter, an unwanted portion of the photosensitive conductive paste is removed through a developing process to form an electrode conductor section 23 with the photosensitive conductive paste 22 patterned, as shown in FIG. 2C. At this time, an overlapped portion of the electrode conductor sections 21, 23 can form a slope at the early stage of overlap by choosing the viscosity of non-photosensitive conductive paste appropriately. Hence, it is possible to relieve the influence of edge cutting of the electrode conductor section 23 on the upper side, or the exudation of paste arising along the corner portion of the electrode conductor section 21 on the lower side.

Thereafter, in a sintering step #16, the electrode conductor section 21 of the non-photosensitive conductive paste and the electrode conductor section 23 of the photosensitive conductive paste are sintered at the same time, so that the electrode conductor section 21 and the electrode conductor section 23 are overlapped with each other to constitute an electrode conductor that electrically conducts on the element 20 such as a dielectric or magnetic substance. The conditions for the drying, exposure and development are the same as those of the first embodiment.

In the second embodiment, since the electrode conductor section 21 of the non-photosensitive conductive paste with a great film thickness and excellent conductivity is obtained relatively easily, it can be employed as a terminal electrode section for outside connection or an electrode section for soldering.

The electrode conductor section 23 of the photosensitive conductive paste can be formed in a fine pattern through the exposure or developing process, and can be utilized as an electrode section for an inductor, a condenser or a filter, whereby the Q value can be increased.

In this way, the second embodiment can bring about the same effects of the first embodiment. By combining merits for the electrode conductor section of the non-photosensitive conductive paste and the electrode conductor section of the photosensitive conductive paste, the precise conductor pattern can be formed on the surface while the thickness and high reliability of the terminal electrode such as normal chip parts are maintained. Accordingly, it is possible not only to enhance the pattern precision which was the conventional problem, but also to produce the electronic component formed with the electrode conductor having a predetermined film thickness and a pattern suitable for the service location.

Third Embodiment

FIGS. 3A to 3D show a third embodiment of this invention, in which an electrode conductor section of the non-photosensitive conductive paste formed in the inner face of a through hole for an element and an electrode conductor section of the photosensitive conductive paste formed on a principal plane of the element are connected with each other.

In this case, in a step #21 of applying the non-photosensitive conductive paste, an electrode conductor section 32 is formed by the non-photosensitive conductive paste in an inner peripheral portion of a through hole 31 for an element 30 such as a dielectric to make up an inductor, a condenser or a filter, and is dried in a drying step #22, as shown in FIG. 3A. At this time, a viscosity of the non-photosensitive conductive paste is adjusted to make an end portion of the electrode conductor section 32 formed at the inner peripheral portion of the through hole 31 be taper shape.

Then, in a step #23 of applying the photosensitive conductive paste, a photosensitive conductive paste 33 is applied on a principal plane (herein an upper face) of the element 30, and is dried in a drying step #24, as shown in FIG. 3B. At this time, an upper end portion of the non-photosensitive conductive paste on the inner face of the through hole and the photosensitive conductive paste are contacted or overlapped with each other partly (i.e., the photosensitive conductive paste flows more or less into the through hole under the gravity).

In a photolithography step #25, the photosensitive conductive paste 33 is exposed in a predetermined pattern. Thereafter, an unwanted portion of the photosensitive conductive paste is removed through a developing process to form an electrode conductor section 34 with the photosensitive conductive paste 33 patterned, as shown in FIG. 3C.

Then, in a sintering step #26, the electrode conductor section 32 of the non-photosensitive conductive paste and the electrode conductor section 34 of the photosensitive conductive paste are sintered at the same time, so that the electrode conductor section 32 and the electrode conductor section 34 are contacted or overlapped with each other to constitute an electrode conductor that electrically conducts on the element 30 such as a dielectric.

The conditions for the drying, exposure and development are the same as those of the first embodiment.

In the third embodiment, since the non-photosensitive conductive paste is provided in the inner face of the through hole where it is difficult to make exposure, the -electrode conductor section 32 can be also formed in the through hole portion with a high aspect ratio, whereby the electronic component having the electrode conductor being electrically conductive to the electrode conductor section 34 of the photosensitive conductive paste on the principal plane can be produced. At this time, since ultraviolet rays for exposure may be transmitted in a depth direction to some extent from the end face of through hole due to forming the taper, the photosensitive conductive paste is hardened near the entrance of through hole, whereby the inside of through hole is not only covered with the electrode conductor section having a sufficient film thickness, but also the film thickness of the edge portion of through hole can be secured to some extent, resulting in higher connection reliability (both the pastes can exist at the edge portion).

Also, since the non-photosensitive conductive paste is employed in the through hole portion, the through hole portion is not unhardened, and the film thickness of the electrode conductor section 32 can be secured sufficiently, so that there is no disconnection due to electrode erosion even though the lead free high temperature solder is employed for soldering.

In the third embodiment as shown in FIG. 3, it is needless to say that the photosensitive conductive paste is laid on the non-photosensitive conductive paste, but conversely the photosensitive conductive paste may be placed underneath. In this case, the patterning can be first made and the non-photosensitive conductive paste applied. Hence, the non-photosensitive conductive paste may not be soaked in the developing solution (e.g., $Na_2CO_3$ solution)

The non-photosensitive conductive paste and the photosensitive conductive paste may be contacted at the end faces. In this case, the thickness is not increased by overlapping, or either of the conductive pastes can be utilized as the boundary (dam) for stopping the flow.

Fourth Embodiment

Figure 4:
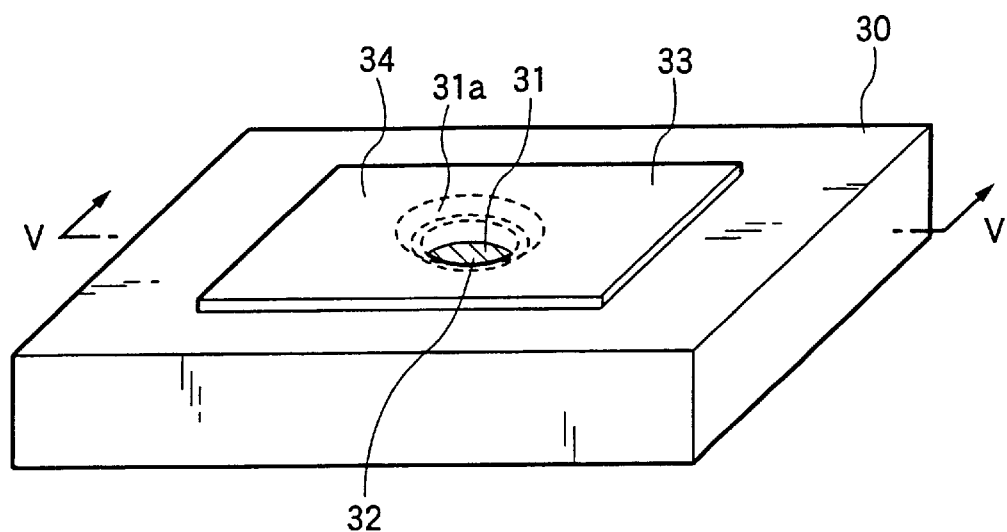
FIG. 4 is a perspective view showing a fourth embodiment of an electronic component, wherein a through hole is provided.
Figure 5:
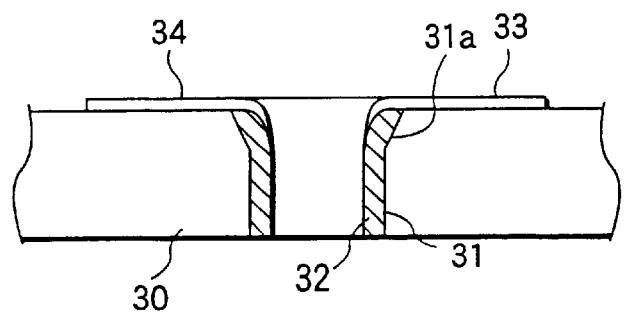
FIG. 5 is a longitudinal cross-sectional view of the through hole in the fourth embodiment.

FIGS. 4 and 5 show a fourth embodiment of this invention, in which an electrode conductor section of the non-photosensitive conductive paste formed in an inner face of a through hole for an element and an electrode conductor section of the photosensitive conductive paste formed on a principal plane of the element are connected with each other.

In this case, a taper connection face 31a is made at an end portion of a through hole 31 on the principal (upper) plane side of the element 30. The angle of this connection face 31a relative to the principal plane is preferably from about 45° to 60°, but is necessary to be tapered. And the non-photosensitive conductive paste is applied in an inner face of the through hole 31 including the taper connection face 31a, and dried to make an electrode conductor section 32. Then the photosensitive conductive paste 33 is applied on the principal plane of the element and the taper connection face 31a, and dried. At this time, the non-photosensitive conductive paste of the taper connection face 31 and the photosensitive conductive paste are overlapped with each other at the end portion of the through hole, as shown in FIG. 5. Thereafter, the photosensitive conductive paste 33 is exposed in a predetermined pattern, and an unwanted portion of the photosensitive conductive paste is removed through a developing process to form an electrode conductor section 34 having the photosensitive conductive paste 33 patterned. And the electrode conductor section 32 of the non-photosensitive conductive paste and the electrode conductor section 34 of the photosensitive conductive paste are sintered at the same time, so that the electrode conductor section 32 and the electrode conductor section 34 are overlapped with each other to constitute an electrode conductor that electrically conducts on the element 30 such as a dielectric. The conditions for the drying, exposure and development may be the same as those of the first embodiment.

In this fourth embodiment, since the taper connection face 31a is formed at the end portion of the inner face of the through hole 31 where it is difficult to make exposure, the non-photosensitive conductive paste and the photosensitive conductive paste are overlapped in a wider area, whereby there is no failure such as edge cutting. Though the ultraviolet ray for use with the exposure travels straightly, the photosensitive conductive paste is securely hardened up to an area where the taper connection face 31a is formed by tapering the end portion of through hole in a range from about 45° to 60°.

Note that the taper connection face may be slanted at a constant degree of inclination, or gradually slanted such as the R face or U face.

Fifth Embodiment

Figure 6:
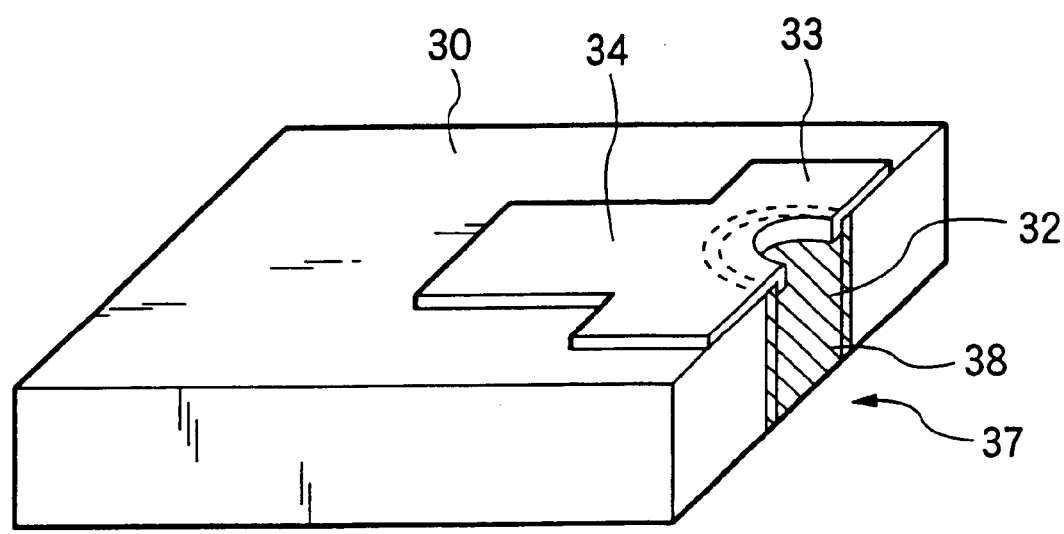
FIG. 6 is a perspective view showing a fifth embodiment of this invention, wherein a through hole is divided into two to make an electrode terminal.

FIG. 6 shows a fifth embodiment of this invention, in which the through hole formed with the electrode conductor according to the third or fourth embodiment is divided into two to constitute an electrode terminal (i.e., a surface mounting terminal) 37 for outside connection in the element 30. In this fifth embodiment, the same or like parts are indicated by the same numerals as in the third or fourth embodiment, and are not described herein.

In this fifth embodiment, the inner face of a circumferential concave face 38 that is one-half of the through hole is not only fully covered with the electrode conductor section 32 of the non-photosensitive conductive paste, but also a sufficient amount of conductor is applied at the edge portion (i.e., both the non-photosensitive and photosensitive conductive pastes can exist at the edge portion), Hence, it can be utilized as the electrode terminal with high reliability without worrying about the solder erosion or disconnection even though used as the electrode terminal.

Sixth Embodiment

FIGS. 7A to 7D show a sixth embodiment of this invention, in which a filter is illustrated employing a non-photosensitive conductive paste in a large film thickness in a region where a chip condenser as a chip component is attached (soldered).

Figure 7A:
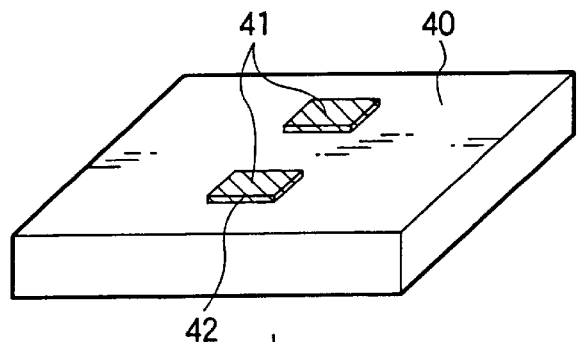
FIGS. 7A to 7D is a perspective view showing a sixth embodiment of this invention, wherein a filter is provided.

First of all, a non-photosensitive conductive paste 41 is applied by screen printing on a principal plane of an element 40 such as an insulator or a dielectric, and dried at 80° C. for ten minutes to constitute a pair of electrode conductor sections 42 of a predetermined shape, for example, square, as shown in FIG. 7A. The electrode conductor sections 42 made of the non-photosensitive conductive paste have a film thickness sufficient to solder the chip parts in the later process.

Figure 7B:
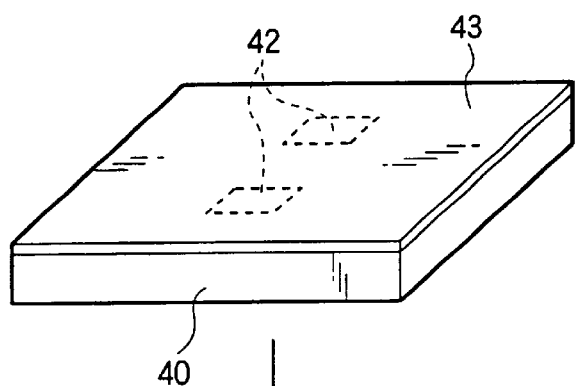
Figure 7C:
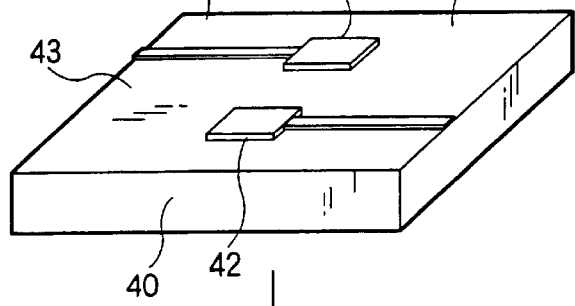
Figure 7D:
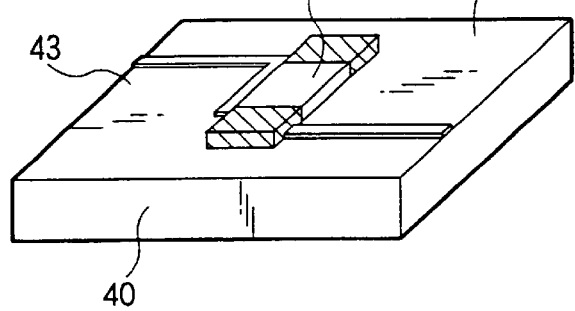

Then, a photosensitive conductive paste 43 is applied again over the entire face including the electrode conductor sections 42, and dried at 80° C. for twenty minutes, as shown in FIG. 7B. And the photosensitive conductive paste 43 is exposed and developed to form an electrode conductor section 44 as a conductor pattern, as shown in FIG. 7C. At this time, on the region where the interconnection is required, the photosensitive conductive paste 43 is laid on the non-photosensitive conductive paste 41, and patterned. Thereafter, a substrate of the element is dried at 80° C. for five minutes, and sintered at 900° C. for one hour, so that the electrode conductor sections 42, 44 are sintered at the same time. Thereby, an electrode conductor that is electrically connected through an overlapped portion of both electrode conductor sections is produced. Then, a chip condenser 45 as a chip component is mounted by soldering on a portion of the electrode conductor section 42 as the chip connecting electrode, as shown in FIG. 7D. Thus, a filter can be fabricated.

The non-photosensitive conductive paste 41 may be patterned with a mask of a conductor pattern in which the photosensitive conductive paste 43 is overlapped at least partly on an upper layer of the non-photosensitive conductive paste 41, and exposed and developed, whereby the chip connecting electrode for soldering the chip condenser 45 can be made in a two-layer structure (i.e., the electrode conductor section 42 is a lower layer and the electrode conductor section 44 is an upper layer).

Further, the non-photosensitive conductive paste 41 may be applied all over the principal plane of the element, and the non-photosensitive conductive paste 41 may be patterned using a conductor pattern having the photosensitive conductive paste 43 exposed and developed as a mask, whereby the conductor pattern, as well as the chip connecting electrode, can be made in a two-layer structure (the electrode conductor section 42 is a lower layer and the electrode conductor section 44 is an upper layer). In this case, the current capacity can be increased. This structure allows the electrode of the conductor pattern to be thicker to increase the power resistance, and is suitable for the parts through which more current is flowed.

Though the electrode conductor sections 42, 44 are sintered at the same time, each of the electrode conductor sections 42, 44 may be sintered in separate process as a matter of fact. The exposure is conducted by the visible ray, near ultra-violet ray, ultra-violet ray, electron beam, X-ray, or laser beam, for example. Among them, the ultra-violet ray is preferable, and the light sources may include a low pressure mercury lamp, a high pressure mercury lamp, an extra-high pressure mercury lamp, and a tungsten halogen bactericidal lamp. In particular, the extra-high pressure mercury lamp is preferable. The exposure of 200 to 800 mJ is conducted. The development of the photosensitive conductive paste after exposure is conducted by spraying or dipping in an alkaline solution such as sodium carbonate, potassium carbonate, calcium hydroxide or sodium hydroxide at temperatures from 20° C. to 50° C.

In this sixth embodiment, the electrode conductor section 42 by the non-photosensitive conductive paste 41 with a great film thickness and excellent conductivity can be obtained relatively easily, thereby being suitable for soldering the chip condenser 45. Namely, a pad having a great film thickness is formed on an electrode face for mounting the chip condenser 45, whereby it is possible to solve the problem with the solder erosion of electrode. Also, the electrode conductor section 44 by the photosensitive conductor paste 43 can be formed in fine pattern at high precision through the exposure and development process, and utilized as the electrode section, whereby a slender pattern can be made in a small area.

Also, with a method of patterning the non-photosensitive conductive paste 41 using a conductor pattern having the photosensitive conductive paste 43 exposed and developed, as a mask, the conductor pattern can be made in two layer structure (the lower layer is the electrode conductor section 42, and the upper layer is the electrode conductor section 44). Hence, the parts with enhanced power resistance through which more current is flowed such as a power inductor can be fabricated.

Seventh Embodiment

Figure 8:
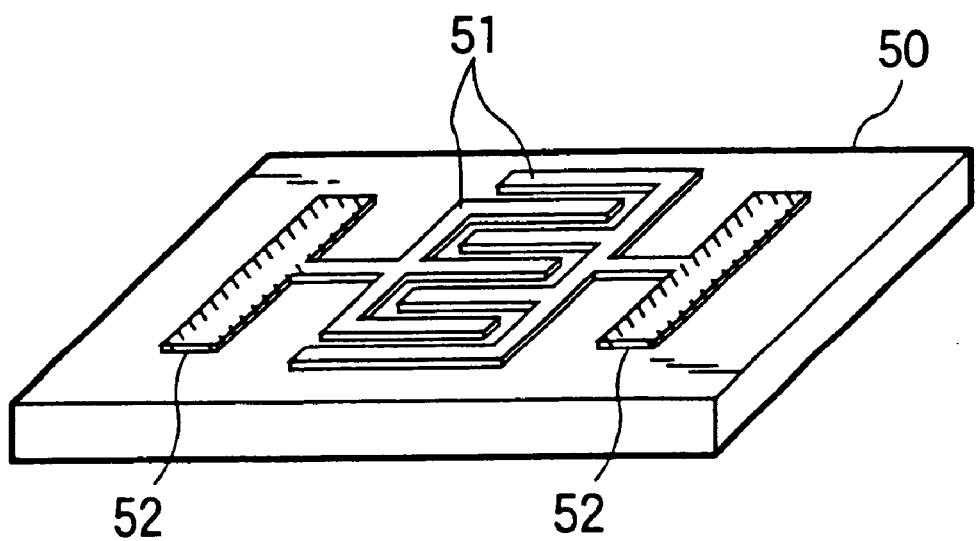
FIG. 8 is a perspective view showing a seventh embodiment of this invention, wherein an electrostatic capacitance pattern is formed.

FIG. 8 shows a seventh embodiment, in which an electrostatic capacitance pattern is formed on a principal plane of an element 50 such as a dielectric or a magnetic substance. An electrode conductor section as an electrostatic capacitance pattern requiring the precision of pattern is formed by exposing and developing the photosensitive conductive paste, and an electrode conductor section as a soldering or outside connecting electrode terminal 52 is formed by the non-photosensitive conductive paste made by screen printing, or in a laminated structure of the non-photosensitive conductive paste and the photosensitive conductive paste. Herein, FIG. 8 shows an instance where an electrostatic capacitance pattern 51 of the photosensitive conductive pattern is formed afterwards. The conditions for the drying, exposure and development may be the same as the sixth embodiment. Additionally, the conductor pattern of the photosensitive conductive paste may be used as a mask to form a pattern of the non-photosensitive conductive paste.

In this seventh embodiment, the electrostatic capacitance pattern 51 that becomes a precise pattern is produced by exposing and developing the photosensitive conductive paste, and the electrode terminal 52 requiring a sufficient film thickness is formed by the non-photosensitive conductive paste, or made in two layer structure of the non-photosensitive conductive paste and the photosensitive conductive paste. Thereby, the characteristics required for each electrode can be implemented.

Eighth Embodiment

FIG. 9 shows an eighth embodiment of this invention, in which after the photosensitive conductive paste is exposed and developed, the non-photosensitive conductive paste is patterned with the photosensitive conductive paste as a mask, whereby a bump as a conjunction conductor projection having the photosensitive conductive paste and the non-photosensitive conductive paste is fabricated.

Figure 9A:
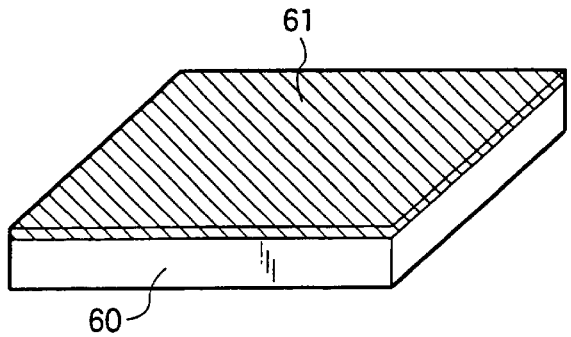
FIGS. 9A to 9D are explanatory views showing an eighth embodiment of this invention, in which the bumps as the joining conductor projection are made.
Figure 9B:
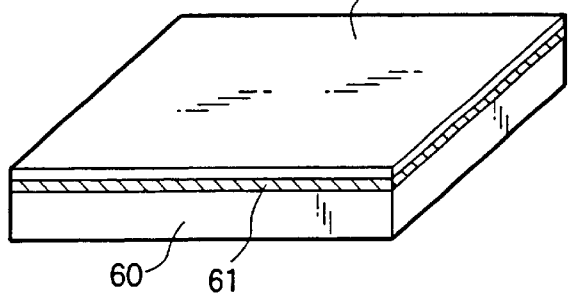
Figure 9C:
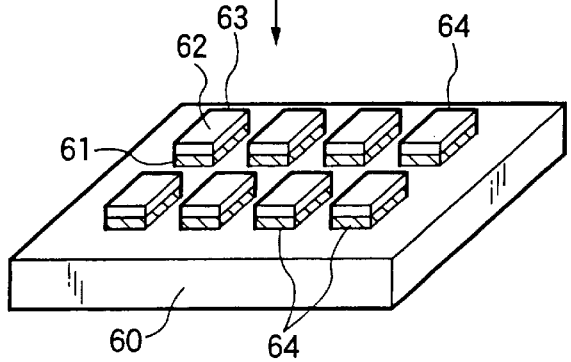
Figure 9D:
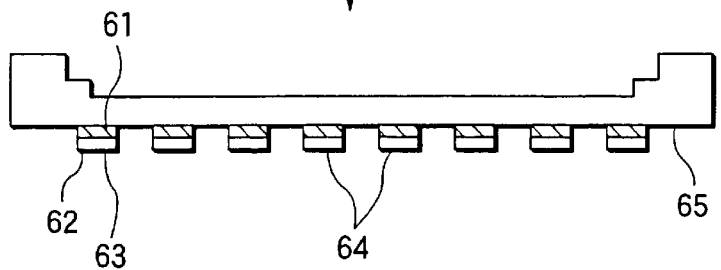

As a method for manufacturing, first of all, a non-photosensitive conductive paste 61 is applied all over a principal plane of an element 60, and dried, as shown in FIG. 9A. As shown in FIG. 9B, a photosensitive conductive paste 62 is applied all over the entire face. After drying, exposure is made, and development is made with a precise bump pattern 63 cured by the ultraviolet ray as a mask. Then the photosensitive and non-photosensitive conductive pastes are removed except for a mask formed portion, and then sintered, to produce a bump 64 having a relatively great thickness and excellent precision, as shown in FIG. 9C. FIG. 9D shows an example in which the bump 64 is formed on the bottom face of an insulating package 65 for mounting various chips.

In this eighth embodiment, the thickness of non-photosensitive conductive paste after sintering is 15 $\mu$m, and the thickness of photosensitive conductive paste after sintering is 7 $\mu$m, so that a bump can be formed having a total thickness of 22 $\mu$m.

In the case where the above process is employed, the non-photosensitive conductive paste uses a binder or monomer that can be developed in an alkaline solution, like the non-photosensitive portion of the photosensitive conductive paste, or if a water soluble binder is employed, the development is commonly enabled.

The shape of the bump 64 thus obtained is higher in prevision and sharper than the bump as thick as 22 $\mu$m by the photosensitive conductive paste alone.

After the photosensitive conductive paste is developed in an alkaline solution, the non-photosensitive conductive paste can be etched by an organic solvent. In this case, since a sensitized portion of the photosensitive conductive paste is swollen, and is more likely to exfoliate, the non-photosensitive conductive paste that is more soluble in the organic solvent is naturally employed, it is desirable to make the etching process in as short time as possible to lessen the load on the paste in consideration of the spray pressure and the spray time. Also, it is important to raise the degree of polymerization, enhance the adherent ability, and further to improve the solvent resistance after exposure of the photosensitive conductive paste in view of the materials.

As for a method of forming a bump using the photosensitive conductive paste, when the film thickness is increased (e.g., 25 $\mu$m or greater) or the narrow pitch is made (e.g., 50 $\mu$m), as described in JP-A-6-151438, the method as described in JP-A-6-151438 is difficult to employ.

As described in JP-A-10-116558, two kinds of photosensitive conductive pastes are used over again, the lower layer paste is the non-photosensitive conductive paste, and exposure and development are conducted with the photosensitive conductive paste as a mask, whereby the electrodes with better pattern precision can be produced.

Ninth Embodiment

FIGS. 10A to 10E show a tenth embodiment of this invention, in which the photosensitive conductive paste is employed for positioning. In this case, a photosensitive conductive paste 81 is applied on a principal plane of the element 80, and dried, whereby an electrode conductor section 82 is formed at high precision in a desired pattern (i.e., a hook shape in the illustrated example) by exposure and development, as shown in FIG. 12A. Then, a non-photosensitive conductive paste 83 is applied inside the electrode conductor section 82 of the photosensitive conductive paste by screen printing, and dried, to form an electrode conductor section 84, as shown in FIG. 12B. At this times since an outer edge portion (outer frame portion) is formed at high precision by the photosensitive conductive paste 81, the non-photosensitive conductive paste 83 applied inside is positioned with respect to the electrode conductor section 82 of the photosensitive conductive paste 81. And both pastes 81, 83 are sintered, an electrode conductor with high positional precision as a whole can be formed on the element 80 in which the electrode conductor section 84 of the non-photosensitive conductive paste 83 is positioned with respect to the electrode conductor section 82 of the photosensitive conductive paste 81.

With this ninth embodiment, the non-photosensitive conductive paste 83 having high flow ability is employed inside, or the non-photosensitive conductive paste 83 having excellent conductivity is applied inside in great thickness, and further the non-photosensitive conductive paste such as Au, Au—Pt, or Ag—Pd can be employed efficiently, while the outside edge portion (outside frame portion) is patterned precisely using the electrode conductor section 82 of the photosensitive conductive paste 81, as shown in FIGS. 10C, 10D or 10E.

Tenth Embodiment

FIGS. 13A and 13B show a tenth embodiment of this invention, in which the photosensitive conductive paste is employed as positioning, and a solder ball (i.e., a spherical solder paste) as the non-photosensitive conductive paste inside thereof is provided to make a solder bump. In this case, a non-photosensitive conductive paste 86 is printed and applied in a predetermined pattern on a principal plane of the element 80, and dried, and a photosensitive conductive paste 87 is applied thereon, and dried, as shown in FIG. 13A. Then an electrode conductor section 88 of desired pattern (e.g., square, or circular frame) is formed at high precision through an exposure and developing process. These conductor sections are sintered, and the solder ball 89 is placed inside the electrode conductor section 88 using a dispenser. And they are reflow heated in a reflow furnace, and bonded with the inside of the electrode conductor section 88 as an electrode conductor section (solder bump) 85 projected as the solder ball 89 is molten. The electrode conductor section 88 of the photosensitive conductive paste 87 functions as a boundary (dam) for stopping the flow, whereby the electrode conductor with soldered bump can be formed on the element 80 at high precision as a whole to prevent the molten solder from broadening more than necessary.

Figure 12:
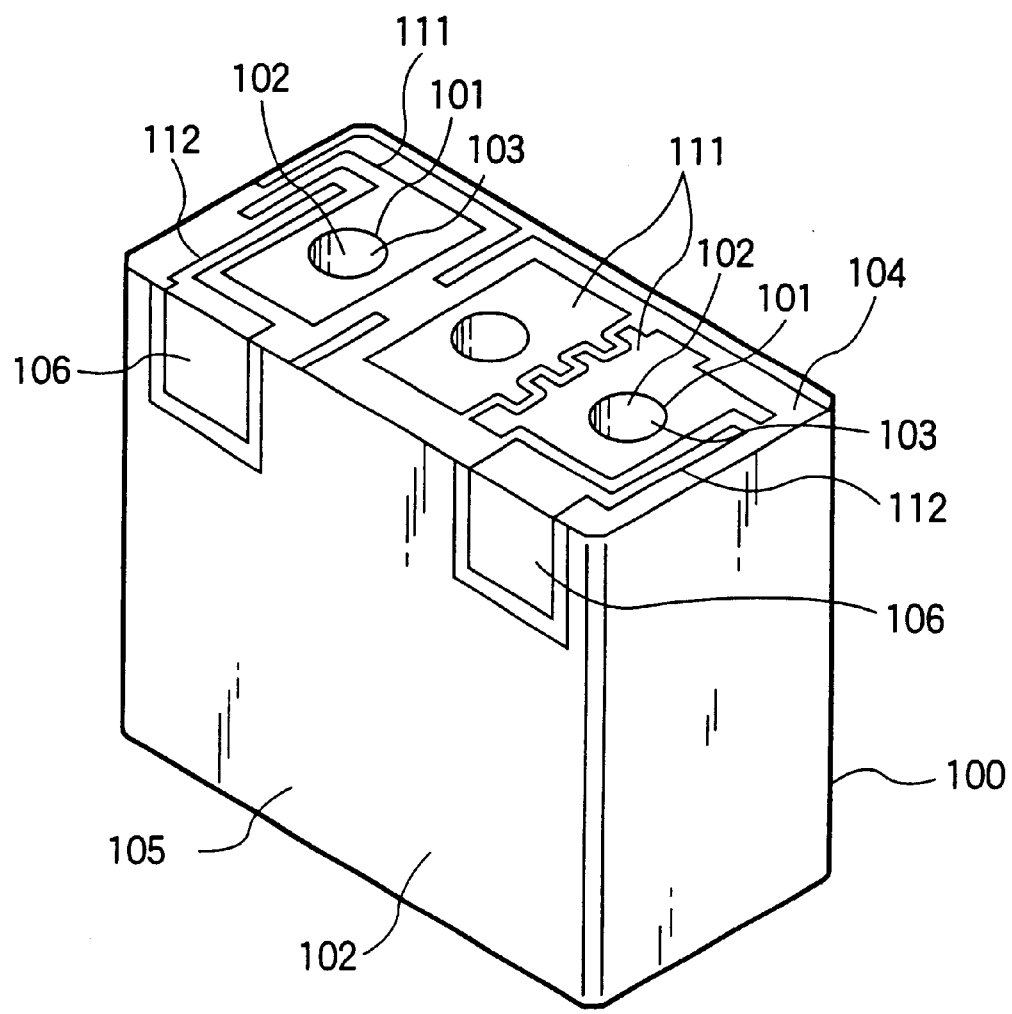
FIG. 12 is a perspective view showing a tenth embodiment of this invention, which is applied to a dielectric filter.

FIG. 12 shows an eleventh embodiment of this invention, which is applied to a dielectric filter. In this figure, a dielectric block 100 as an element is provided with a plurality of through bores 101 side by side. On the inner peripheral face of the through bores 101 punched (opened) through this principal plane, an inner peripheral electrode conductor section 103 is covered with a non-photosensitive conductive paste 102 to constitute a resonator, and on an outside face of the dielectric block 100 excluding an open end face 104 through which the through bores 101 of the dielectric block 100 are opened, an outside electrode conductor section 105 by the non-photosensitive conductive paste is provided to form an input and output electrode conductor section 106 isolated and partitioned from the outside electrode conductor section 105. On the other hand, on the open end face 104 that is the principal plane of the dielectric block, the coupling electrode conductor sections 111, 112 (making up a coupling capacitor) formed by exposing and developing the photosensitive conductive paste 110. The coupling electrode conductor section 11 is connected in contact with or overlapped with the inner peripheral electrode conductor section 103 near the opening portion of the through bore on the principal plane. The coupling electrode conductor section 112 is connected in contact with or overlapped with the input and output electrode conductor section 106. The connection between the coupling electrode conductor section 111 and the inner peripheral electrode conductor section 103 can be effected in the same way as with the through hole as shown in FIGS. 3 to 5. Similarly, the coupling electrode conductor section 112 and the input and output electrode conductor section 106 can be effected in the same way as with the through hole as shown in FIGS. 3 to 5. That is, an upper end of the conductor section 106 is tapered by adjusting the viscosity of the non-photosensitive conductive paste 102.

Note that the photosensitive conductive paste and the non-photosensitive conductive paste maybe applied in any order, and both pastes may be sintered at the same time or separately.

In this eleventh embodiment, the coupling electrode conductor sections 111, 112 are formed through the exposure and developing process of the photosensitive conductive paste. Therefore, the dimensional precision of the pattern itself is high, the pattern causes no distortion as the paste is exudated, and there is less dispersion in pattern width. Further, the characteristics of the coupling electrode conductor section of dielectric filter depend on the distance of the conducting member up to as high as about 5 $\mu$m from the surface of dielectric block. Accordingly, the exudation of pattern and the dispersion in width should be not only less, but also the side face should be as vertical as possible to the cross section. Also, the coupling electrode conductor sections 111, 112 are required to have a positional precision for the through bores and a positional precision for the input and output electrode terminals on the lateral face. This portion has a great effect on the filter characteristics of the dielectric filter. Through the exposure and developing process of the photosensitive conductive paste, the coupling electrode conductor sections 111, 112 are patterned, whereby these requirements can be met. By decreasing the dispersion in filter characteristics, it is possible to omit the adjustment operation (e.g., trimming operation) of adjusting the characteristics for the finished products.

Besides the above method of manufacturing, there is another method of forming the pattern by plating. With this method, the raw surface must be roughened to increase the adherence of plating, so that the roughness of the surface may degrade the filter characteristics. If the photosensitive conductive paste is employed, the pattern can be made at an appropriate adherence irrespective of depending on the roughness of the raw surface. Hence, the stable characteristics can be attained by polishing at a roughness best suited for the product characteristics. On the contrary, with the screen printing, if the raw surface is too rough, the line width is varied, or conversely if it is flat, the paste is exuded, whereby it is very difficult to control the viscosity of paste or the roughness.

Note that the patterns can be made on the face where the input and output electrode terminals are produced through the exposure and developing process of the photosensitive conductive paste. There is the same effect as the pattern formation on the open-end face 104. In particular, if the positional precision of the coupling electrode conductor section or the input and output electrode conductor section 106 for the through bore is excellent, it is possible to omit the adjustment process such as trimming.

In the eleventh embodiment, the coupling electrode conductor section is provided on the open-end face of the dielectric block. However, in the case where other electrode conductor sections for adjusting the filter characteristics are provided on the open-end face, the same effect can be also attained by forming the fine patterns through the exposure and developing process of the photosensitive conductive paste.

In this way, when applied to the dielectric filter, the positional precision of conductor pattern, the precision of line width, and the pattern shape can be stabilized, the dispersion in filter characteristics of the final products is eliminated, and the adjustment process such as trimming which was conventionally performed can be dispensed with, whereby the products superior in the reliability can be fabricated with the reduced costs.

Twelfth Embodiment

Figure 13:
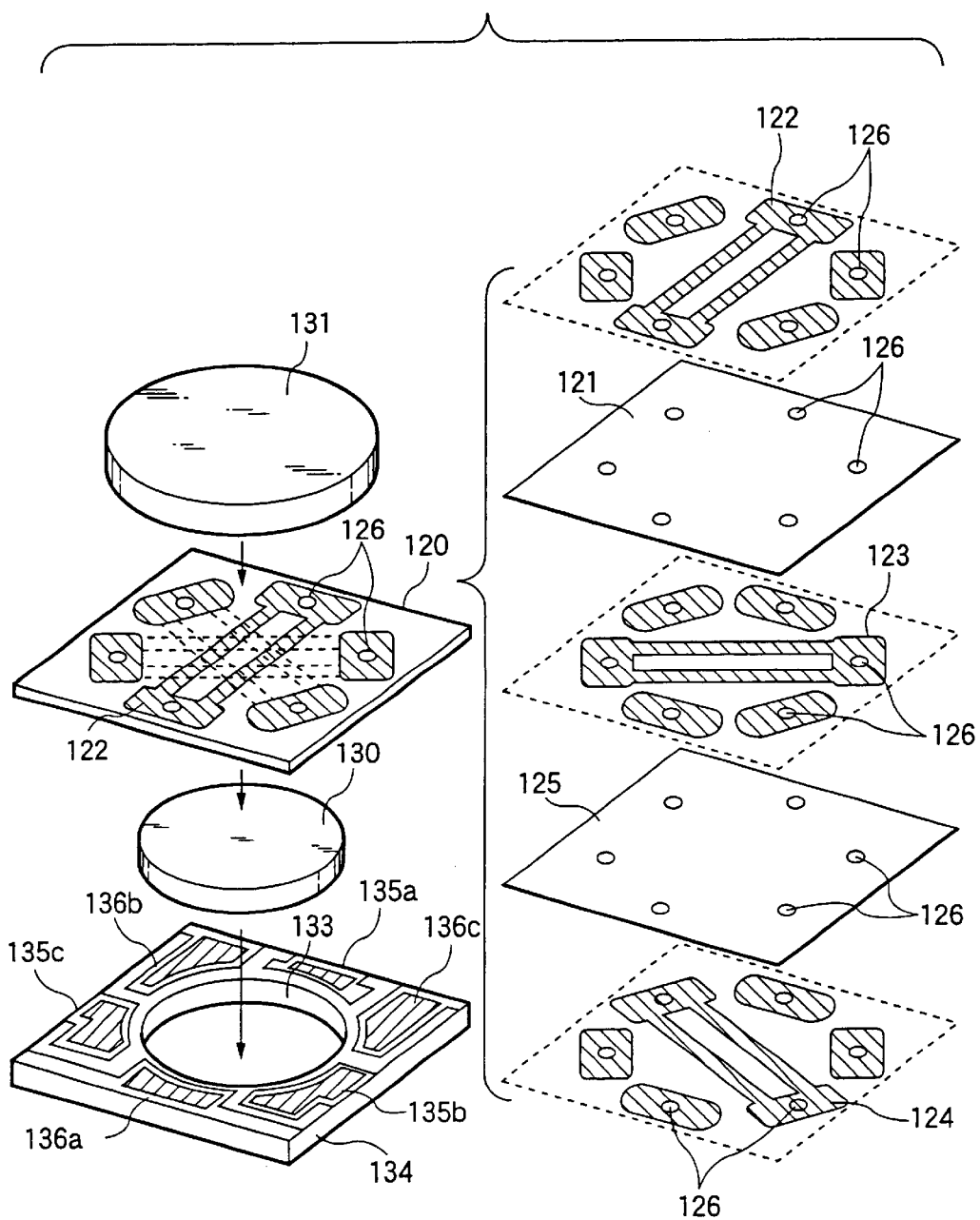
FIG. 13 is an exploded perspective view showing an eleventh embodiment of this invention, which is applied to a non-reciprocal circuit element.

FIG. 13 shows a twelfth embodiment of this invention, in which a non-reciprocal circuit element such as a circulator or an isolator is produced. In this figure, the non-reciprocal circuit element comprises a multi-layer substrate 120 as an element formed with a central conductor, a ferrite 130 placed in proximity on one side, a permanent magnet 131 placed in proximity on the other side of the multi-layer substrate 120, and a terminal plate 134 having a hole portion 133 where the ferrite 130 is disposed.

In the multi-layer substrate 120 formed with the central conductor, for example, an electrode conductor containing the central conductor 122 at the first layer is patterned on an upper face of the insulating substrate 121 at the first layer. Also, on the lower face of the substrate 121, an electrode conductor section containing the central conductor 123 at the second layer is patterned. Also, on the lower face of the insulating substrate 125 at the second layer, an electrode conductor containing the central conductor 124 at the third layer is patterned. After each of the central conductors 122, 123 and 124 is patterned, the insulating substrates 121, 125 at the first and second layers are pasted together to produce the multi-layer substrate 120. In the multi-layer substrate 120 (insulating substrates 121, 125), a through hole 126 is formed to lead out an end portion of each central conductor. And the multi-layer substrate 120 is sintered to produce a substrate with desired electrode conductors.

On the terminal plate 134, the electrode terminals 135*a*, 135*b*, 135*c* and the ground electrodes 136*a*, 136*b*, 136*c* are formed by screen printing of the photosensitive conductive paste, and sintered, to make an electrode conductor. The electrode terminals 135*a*, 135*b*, 135*c* and the ground electrodes 136*a*, 136*b*, 136*c* on the lateral face and the portion to be soldered are formed partly (as indicated by the slant line in the figure) by screen printing of the non-photosensitive conductive paste, and sintered to make an electrode conductor.

One end portion of the central conductors 122, 123 and 124 provided on the multi-layer substrate 120 is connected through a through hole 126 to the electrode terminals 135*a*, 13*b* and 135*c*, and led out, while the other end portion of the central conductors 122, 123 and 124 is connected through the through hole 126 to the ground electrodes 136*a*, 136*b* and 136*c*.

In this fifteenth embodiment, the electrode terminal and the ground electrode such as a circulator or an isolator to hold a capacitance value at high precision can be patterned by the photosensitive conductive paste at high precision, and the necessary portion of soldering can be thick enough by screen printing of the photosensitive conductive paste and the non-photosensitive conductive paste.

Thirteenth Embodiment

Figure 14:
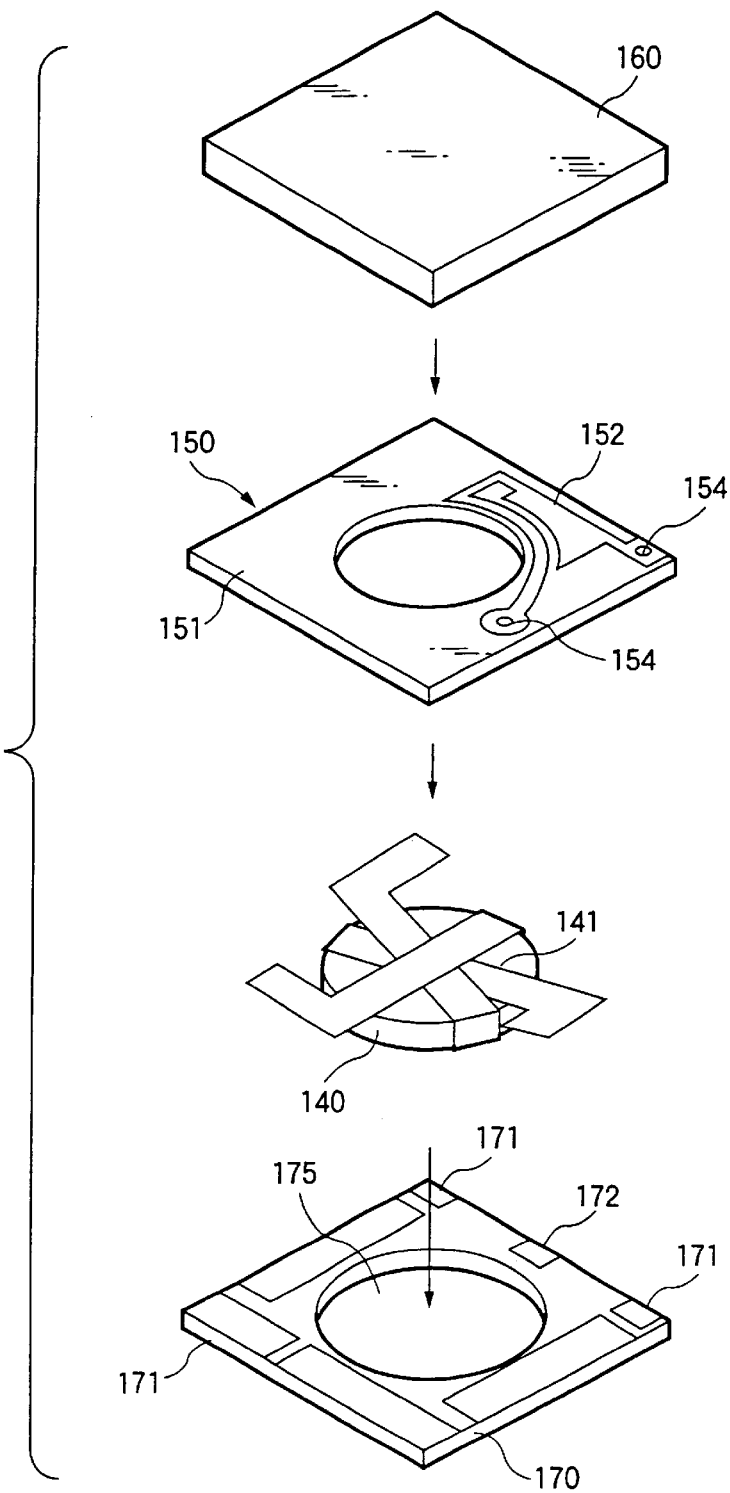
FIG. 14 is an exploded perspective view showing a twelfth embodiment of this invention, which is applied to a non-reciprocal circuit element.

FIG. 14 shows a thirteenth embodiment of this invention, in which a non-reciprocal circuit element such as a circulator or an isolator is made. In this figure, the non-reciprocal circuit element comprises a ferrite 140 provided with a central electrode 141, a condenser substrate 150 and a permanent magnet 160 laid thereon, and a terminal plate 170 having a hole portion 175 into which the ferrite 140 is fitted.

Figure 15A:
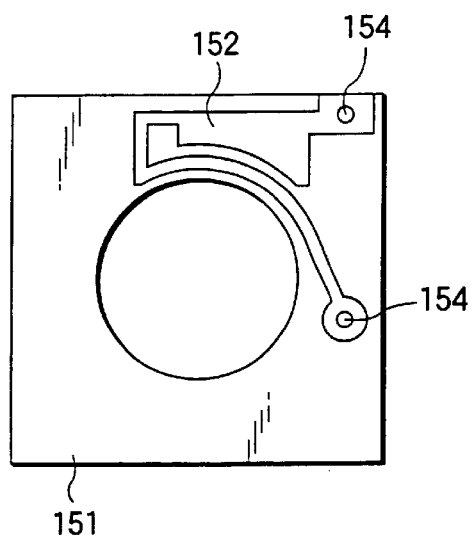
FIGS. 15A and 15B are plan views of a condenser substrate for use in the thirteenth embodiment.
Figure 15B:
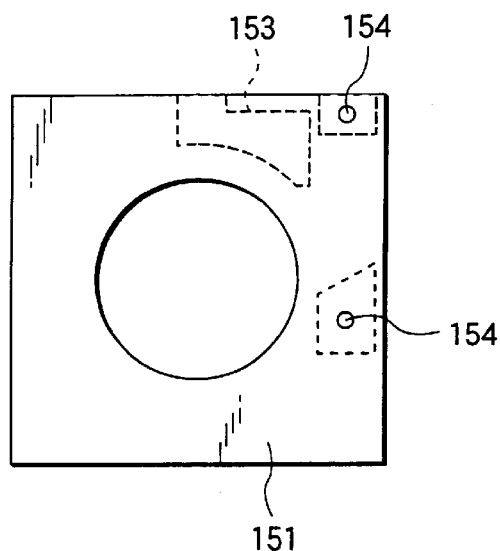

As shown in FIG. 15, the condenser substrate 150 is one in which the capacitance electrode conductor sections 152, 153 are patterned on the upper and lower faces of a dielectric substrate 151 as an element through the exposure and developing process. The dielectric substrate 151 is formed with a through hole 154 for leading out an end portion of the central conductor 141 via the electrode conductor section 152 to an input/output terminal 171 on the terminal plate 170, and the through hole 154 is coated with the non-photosensitive conductive paste. The electrode conductor sections 152, 153 are opposed to each other via the dielectric substrate 151 to provide an electrostatic capacitance. The electrode conductor section 153 is connected to a ground electrode 172 of the terminal plate 170.

Further, the terminal plate 170 in the sixteenth embodiment can be constituted in the same way as the terminal plate 134 of the fifteenth embodiment.

In this sixteenth embodiment, the capacitance electrode conductor sections 152, 153 of the condenser substrate 150 such as a circulator or an isolator are patterned by exposing and developing the photosensitive conductive paste, whereby the dispersion in electrostatic capacitance can be reduced, and the fine adjustment of electrostatic capacitance can be omitted.

Note that the connection between the capacitance electrode conductor section and the through hole can be effected as shown in FIGS. 3 to 5.

Fourteenth Embodiment

Figure 16:
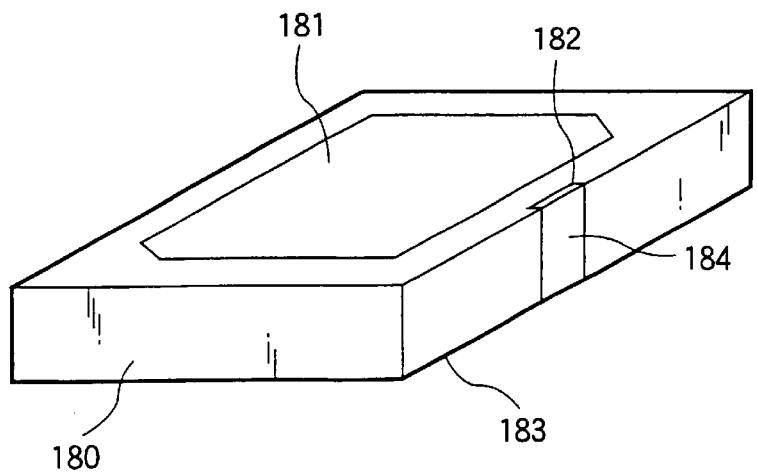
FIG. 16 is a perspective view showing a fourteenth embodiment of this invention, which is applied to a patch antenna.
Figure 17A:
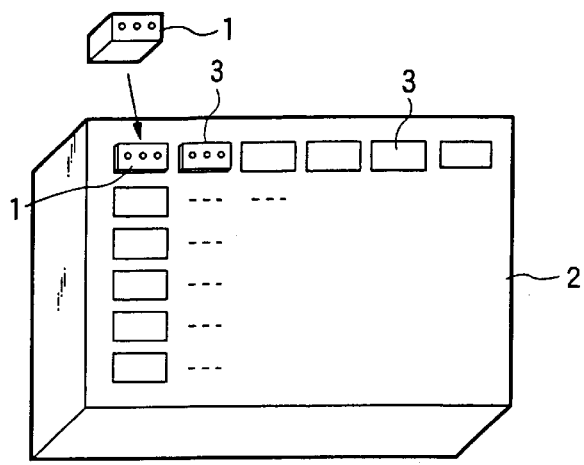
FIGS. 17A to 17E are explanatory views illustrating an example of pattern formation with the conventional screen printing.
Figure 17B:
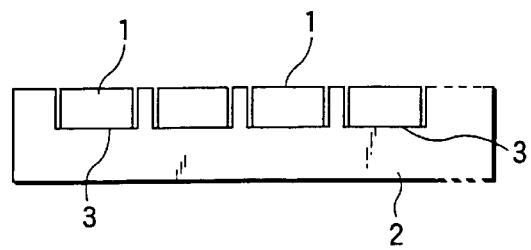
Figure 17C:
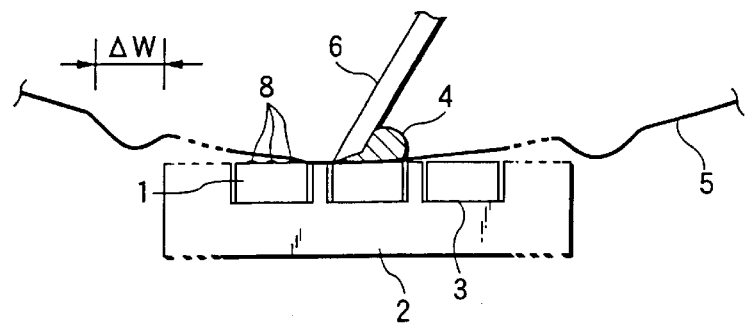
Figure 17D:
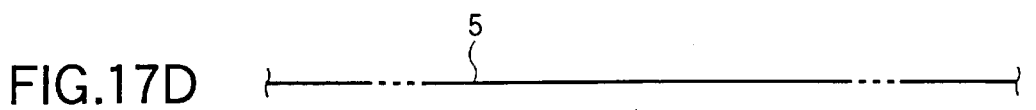
Figure 17E:
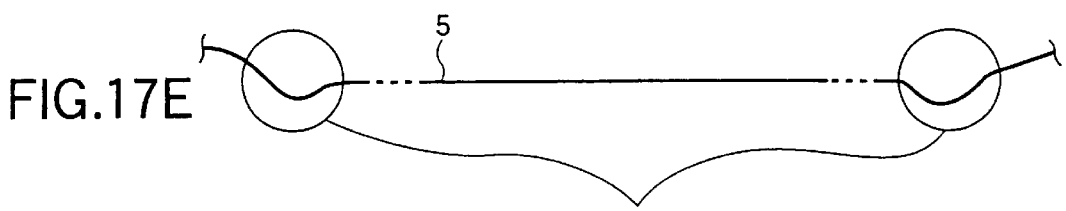

FIG. 16 show a fourteenth embodiment of this invention, in which a patch antenna for use with the car navigation (GPS) antenna, the portable telephone, or the radio LAN antenna for the personal computer is configured. In this figure, on a principal plane (upper face) of a dielectric substrate 180 as the element, an antenna electrode conductor section 181 (which may actually have a more complex shape than in the figure) and a gap forming electrode conductor section 182 disposed in a predetermined spacing with respect thereto are patterned. Also, on a lower face and a side face of the dielectric plate 180, an earth electrode conductor section 183 and a band-like connecting electrode conductor section 184 connecting thereto are formed by printing and applying the non-photosensitive conductive paste. The connecting electrode conductor section 184 is configured to be in contact with the gap forming electrode conductor section 182 or overlapped partly to be electrically conducting. The earth electrode conductor section 183 is provided all over the lower face of the dielectric plate 180. These electrode conductor sections are sintered separately or concurrently for the photosensitive conductive paste and the non-photosensitive conductive paste.

With this seventeenth embodiment, the antenna electrode conductor section 181 and the gap forming electrode conductor section 182, for which the position or gap of the dielectric plate 180 is important, can be patterned at high precision through the exposure and developing process of the photosensitive conductive paste. As a result, a patch antenna with excellent characteristics can be obtained.

Though the embodiments of the invention have been described above, it will be apparent to those skilled in the art that the present invention is not limited to these embodiments, and various variations or modifications can be made within the scope of the invention as defined in the claims.

As described above, with the present invention, the electrode conductor section of the photosensitive conductive paste and the electrode conductor section of the non-photosensitive conductive paste are at least partly contacted or overlapped with each other to make an electrode conductor that electrically conducts. Therefor, the conductor pattern is produced not only at a higher precision, but also the pattern and the electrode can be formed in a predetermined film thickness suitable for the location where the electronic component is employed. The portion having a high aspect ratio such as the inner face of through hole where it was difficult to make exposure previously, can be made conductive, and the inner face of though hole and the surface pattern can be interconnected. Also, the portion that is patterned through an exposure and development process of the photosensitive conductive paste is less dislocated owing to the degradation of screen, as compared with the patterning by screen printing, so that the pattern positional precision is improved. Hence, there is the effect that the dispersion in characteristics of the products can be reduced considerably. Further, the photosensitive conductive paste is applied over again on the non-photosensitive conductive paste, and this photosensitive conductive paste is employed as a mask, whereby the electrode or pattern having a great film thickness can be formed. And the patterning is effected at high precision and with narrow pitch, whereby there is the effect that the countermeasure for solder erosion and the enhancement of the electrical conductivity can be made.

What is claimed is:

1. The electronic component comprising:
   a first electrode conductor section formed of the non-photosensitive conductive paste on a surface connected with a principal surface, an end portion at the principal surface side being made taper shape; and
   a second electrode conductor section having the photosensitive conductive paste exposed and developed on said principal surface;
   wherein the end portion of the first electrode conductor section having a taper shape is overlapped at least a part of the second electrode conductor.

2. The electronic component according to claim 1, wherein the first electrode conductor section formed of said non-photosensitive conductive paste constitutes an end face electrode or a side face electrode on an end face or a side face of said component.

3. The electronic component according to claim 1, wherein said surface connecting with said principal surface has a taper connection face, and the second electrode conductor formed by said photosensitive conductive extends from said principal plane to said taper connection face to overlap each other.

4. A method for manufacturing an electronic component comprising: the steps of:
   forming a first electrode conductor section of a non-photosensitive conductive pattern on a surface connected with a principal surface, an end portion at the principal surface side being made taper shape the other plane;
   forming a second electrode conductor section having a photosensitive conductive paste exposed and developed on said principal surface;

wherein the end portion of the first electrode conductor section having a taper shape is overlapped at least a part of the second electrode conductor.

5. The method for manufacturing the electronic component according to claim 4, said surface connecting with said principal surface has a taper connection face, and the second electrode conductor formed by said photosensitive conductive extends from said principal plane to said taper connection face to overlap each other.

* * * * *